(12) United States Patent  
Nealis

(10) Patent No.: US 6,618,250 B2
(45) Date of Patent: Sep. 9, 2003

(54) MODULAR ELECTRONICS ENCLOSURE

(75) Inventor: Edwin John Nealis, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/943,391

(22) Filed: Aug. 30, 2001

(65) Prior Publication Data

US 2003/0043547 A1 Mar. 6, 2003

(51) Int. Cl.[7] .............................................. H05K 7/20
(52) U.S. Cl. .................... 361/704; 165/80.3; 257/719; 361/715; 361/809; 29/890.03
(58) Field of Search ................. 29/890.03; 62/259.2; 361/689, 700, 704, 715, 707–712, 716, 722, 807–809, 825; 165/80.3, 80.4, 185, 104.21, 104.33; 257/706, 707, 715, 718, 719, 726, 727

(56) References Cited

U.S. PATENT DOCUMENTS

| | | | | |
|---|---|---|---|---|
| 3,859,570 A | * | 1/1975 | Veranth et al. | 361/717 |
| 4,219,009 A | * | 8/1980 | Palmer | 126/599 |
| 5,438,162 A | | 8/1995 | Thompson et al. | |
| 5,517,058 A | * | 5/1996 | Temple | 257/692 |
| 6,024,165 A | * | 2/2000 | Melane et al. | 165/104.33 |
| 6,104,611 A | | 8/2000 | Glover et al. | |
| 6,169,247 B1 | | 1/2001 | Craft, Jr. et al. | |
| 6,212,074 B1 | * | 4/2001 | Gonsalves et al. | 361/717 |
| 6,330,745 B1 | * | 12/2001 | Cromwell et al. | 29/832 |
| 6,345,512 B1 | * | 2/2002 | Cosley et al. | 62/259.2 |
| 6,366,460 B1 | * | 4/2002 | Stone et al. | 361/687 |

* cited by examiner

Primary Examiner—Gerald Tolin
(74) Attorney, Agent, or Firm—Coats & Bennett, P.L.L.C.

(57) ABSTRACT

An electronics enclosure includes a mounting bracket adapted to mount to a support structure, a heat absorption module adapted to mount to the mounting bracket, and a housing to contain electronic equipment. The housing is adapted to mount alternatively to either the mounting bracket or the heat absorption module dependent upon solar loading conditions.

26 Claims, 5 Drawing Sheets

MODULAR ELECTRONICS ENCLOSURE

BACKGROUND OF THE INVENTION

The present invention relates generally to outdoor enclosures for electronic components and, more particularly, to an outdoor enclosure for electronic components that uses passive heating and cooling to control the temperature of the enclosure.

When telecommunications equipment is deployed in outdoor locations, a cabinet or enclosure protects the electronics from weather and environmental contaminants. The reliability of electronic components decreases significantly if they are subjected to high temperature extremes, especially if the temperature swings or cycles are frequent. The temperature swings may be due to heat generated by the electronics (i.e., more heat is produced at peak times), natural temperature variations, and solar loading. To protect the electronics equipment, various methods are used to control the internal temperature of the electronics enclosure.

Ventilated cabinets are sometimes used to cool electronics equipment inside an enclosure or cabinet. Ventilated cabinets use natural or forced convection to draw ambient air through the cabinet to cool the equipment inside the cabinet. Ventilated cabinets are relatively inexpensive and require little maintenance. However, the electronics inside the ventilated cabinet are exposed to the air flow, which may contain environmental contaminants, such as moisture, nitrates, hydrocarbons, sulfur dioxide, nitrogen oxides, hydrogen sulfides, chlorine, ozone, salt, and the like.

Sealed cabinets provide an alternative to ventilated cabinets where environmental contamination is a concern. Sealed cabinets use heating and cooling systems to maintain the electronics in the cabinet within the desired temperature range without exposing the electronics to potentially harmful contaminants. The heating and cooling systems include fans, air conditioners, and heaters, which consume space in the cabinet and add considerably to the cost of the cabinet. Additionally, such components require periodic maintenance to maintain them in proper operating condition.

Passive cooling methods for cooling electronics enclosures are also known. Passive cooling relies on conduction and radiation to passively cool the electronics equipment inside an enclosure without fans, air conditioners, or heat exchangers. Passive cooling of electronics enclosures is less expensive than active cooling systems, reduces energy consumption, and minimizes noise. Additionally, because there are fewer components to fail, passive cooling systems are generally more reliable and robust than active cooling systems.

Passive cooling systems for electronics enclosures dissipate heat generated by the electronics through natural convection and radiation. However, if the enclosure is placed in direct sunlight, the solar load on the cabinet may be as many more times that of the heating load of the electronics. In order to dissipate heat generated by the solar load using passive methods, a phase change material (PCM) is typically used. Phase change materials are materials that change state (e.g., from solid to liquid and vice versa) as the temperature changes. The temperature at which the PCM changes state is referred to as the phase change temperature. As heat builds up in the enclosure, the PCM begins to change from solid to liquid when the temperature inside the enclosure reaches the phase change temperature. While the phase change is occurring, the PCM continues to absorb heat while the temperature remains the same. The temperature does not begin to increase again until the PCM has changed phase. The amount of heat, or energy, required to change the PCM from one phase to another is called the latent heat of the PCM. Conversely, when the solar load is removed and the temperature inside the enclosure begins to cool, the temperature of the PCM also reduces and it changes back to a solid state.

BRIEF SUMMARY OF THE INVENTION

The present invention relates generally to a passively-cooled electronics enclosure for use outdoors. The electronics enclosure comprises an electronics cabinet or housing, a mounting bracket for mounting the electronics housing to a support structure, and a heat absorption module. The electronics housing may be directly mounted to the mounting bracket or, alternatively, may be mounted to the heat absorption module which, in turn, mounts to the mounting bracket. Thus, the electronics housing may be used with or without the heat absorption module. When the electronics enclosure is deployed in a location where it is not exposed to direct sunlight, it may be used without a heat absorption module. Conversely, when the electronics enclosure is deployed in a location where it is subjected to solar loading, the heat absorption module may be used to passively cool the electronics housing.

DETAILED DESCRIPTION OF THE INVENTION

Figure 1:
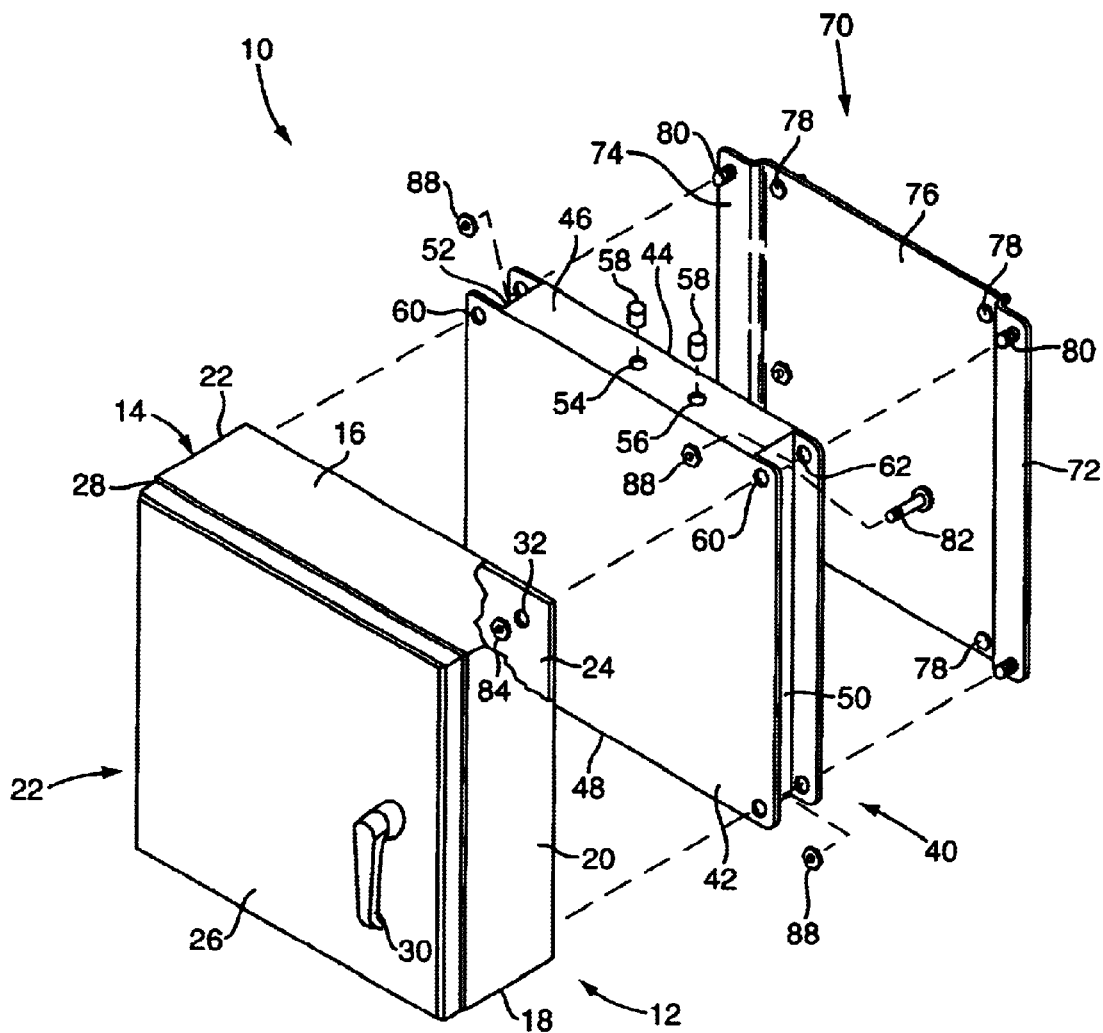
FIG. 1 is an exploded perspective view of the modular electronics enclosure of the present invention.
Figure 2:
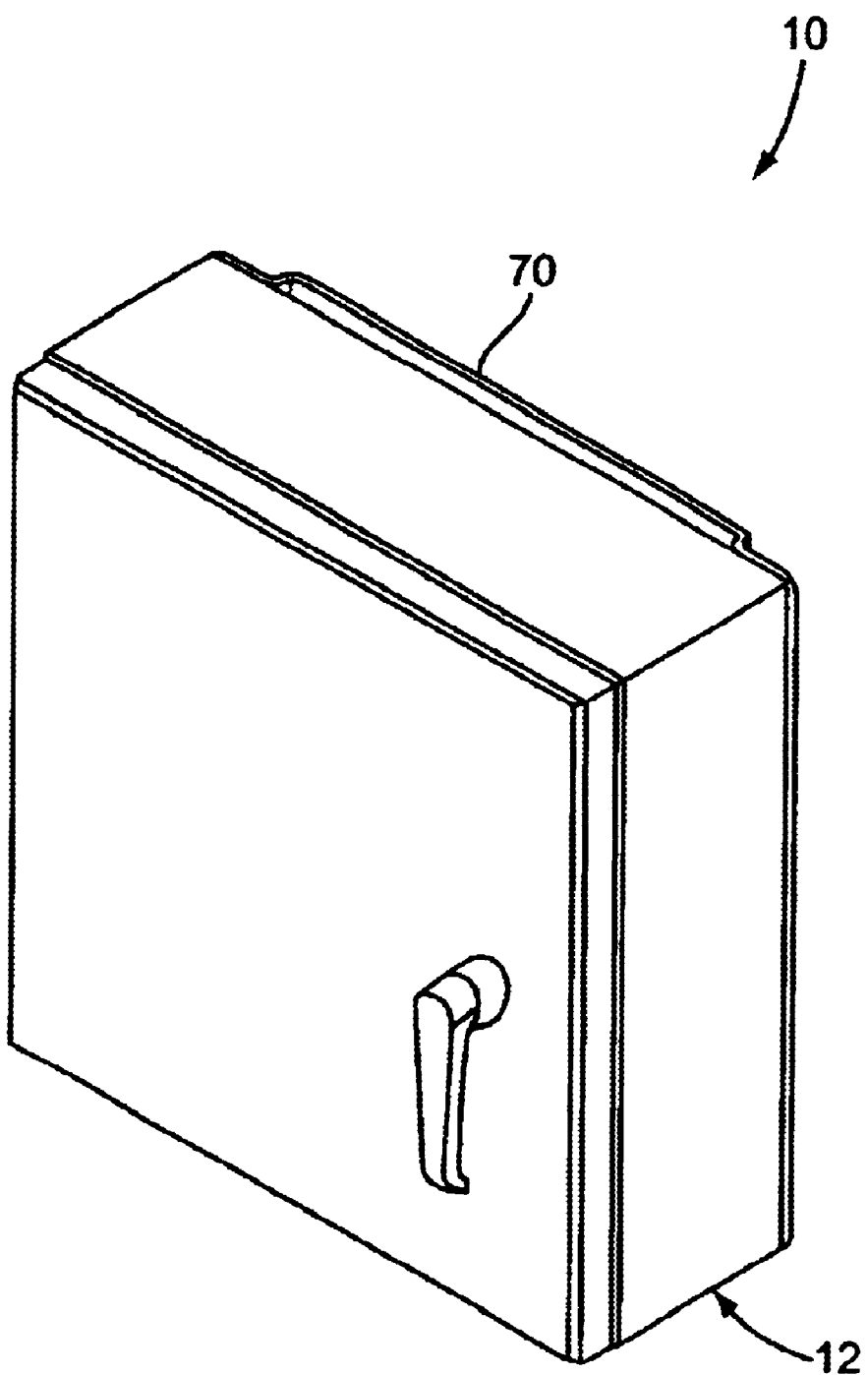
FIG. 2 is a perspective view of the modular electronics enclosure assembled without the heat absorption module.
Figure 3:
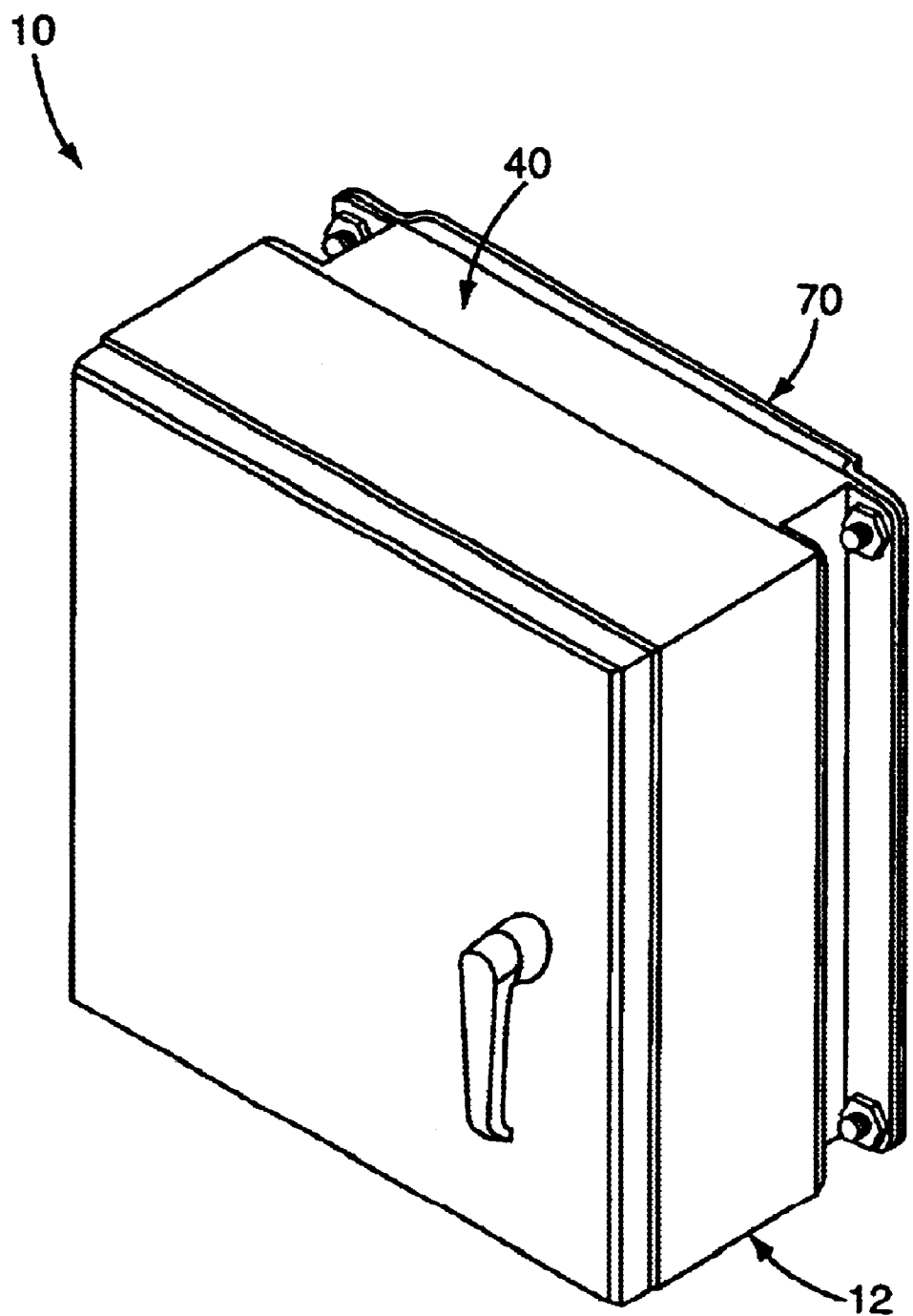
FIG. 3 is a perspective view of the modular electronics enclosure assembled with the heat absorption module.

Referring now to the drawings, the electronics enclosure of the present invention is shown therein and indicated generally by the numeral 10. The electronics enclosure 10 comprises three main components: a housing 12, a heat absorption module 40, and a mounting bracket 70. The housing 12 is designed to mount directly to the mounting bracket 70 or, alternatively, to the heat absorption module 40. The heat absorption module 40, when used, mounts to the mounting bracket 70.

The housing 12 comprises a main body 14 and an access door 26. Main body 14 comprises a substantially rectangular box made of a sheet metal or other heat conductive material. The main body 14 includes a top 16, bottom 18, sides 20, 22, and back 24. A hinge 28 pivotally mounts the door 26 to one side 20 or 22 of the housing 12. Door 26 includes a handle 30 for opening and closing the door 26. Handle 30 may incorporate a conventional latch or locking mechanism to provide security. A door seal (not shown) may be provided to prevent moisture or other contaminants from entering the housing 12. The back 24 of the housing 12 includes a series of mounting holes 32 used for mounting the housing 12 to a support structure. The number of mounting holes 32 is not material to the invention. In the exemplary embodiment shown in the drawings, there are four mounting holes 32 disposed adjacent the four corners of the housing 12. As will be hereinafter described, the mounting holes 32 receive mounting studs 80 on the mounting bracket 70.

The heat absorption module 40 is a sealed enclosure made of metal or other heat conductive material. In the exemplary embodiment shown in FIG. 1, the heat absorption module 40 comprises a front plate 42, back plate 44, top 46, bottom 48, and sides 50, 52. The front plate 42, back plate 44, top 46, bottom 48, and sides 50, 52 are secured together by welding to form a sealed enclosure. A fill hole 54 and vent hole 56 are formed in the top 46 of the heat absorption module 40. The fill hole 54 is used to fill the heat absorption module 40 with a phase change material (PCM). The PCM is heated to change it to a liquid state and then poured into the heat absorption module 40. Vent hole 56 allows air to escape from within the heat absorption module 40 during filling. After filling, the fill hole 54 and vent hole 56 are sealed by plugs 58.

The front plate 42 and back plate 44 of the heat absorption module 40 extend beyond the sides 50, 52 in the exemplary embodiment shown in FIG. 1. Both the front plate 42 and back plate 44 include a series of mounting holes 60, 62. The mounting holes 62 in the back plate 44 receive mounting studs 80 on the mounting bracket 70, as will be hereinafter described. The mounting holes 60 on the front plate 42 receive a bolt used to fasten the housing 12 to the heat absorption module 40.

Mounting bracket 70 is a formed metal sheet having side portions 72, 74 and a recessed central portion 76. The central portion 76 includes a series of mounting holes 78 to receive bolts, lag screws, or other mounting hardware. Mounting studs 80 project from the side portions 72, 74. When the housing 12 is mounted directly to the mounting bracket 70, the mounting studs 80 are received in the mounting holes 32 in the back 24 of the housing 12. When the heat absorption module 40 is used, the mounting studs 80 are received in the mounting holes 62 in the back plate 44 of the heat absorption module 40. In either case, the housing 12 or heat absorption module 40 is secured in place by nuts 88 that thread onto the mounting studs 80. When the heat absorption module 40 is required, the housing 12 can be mounted to the heat absorption module 40 by carriage bolts 82 and nuts 84, or other mounting hardware. In the exemplary embodiment of FIG. 1, the bolts 82 pass through the opening 60 in the front wall 42 of heat absorption module 40 and the opening 32 in the back 24 of housing 12. The nuts 84 thread onto the end of the carriage bolts 82 to secure housing 12 to the heat absorption module 40.

Figure 4:
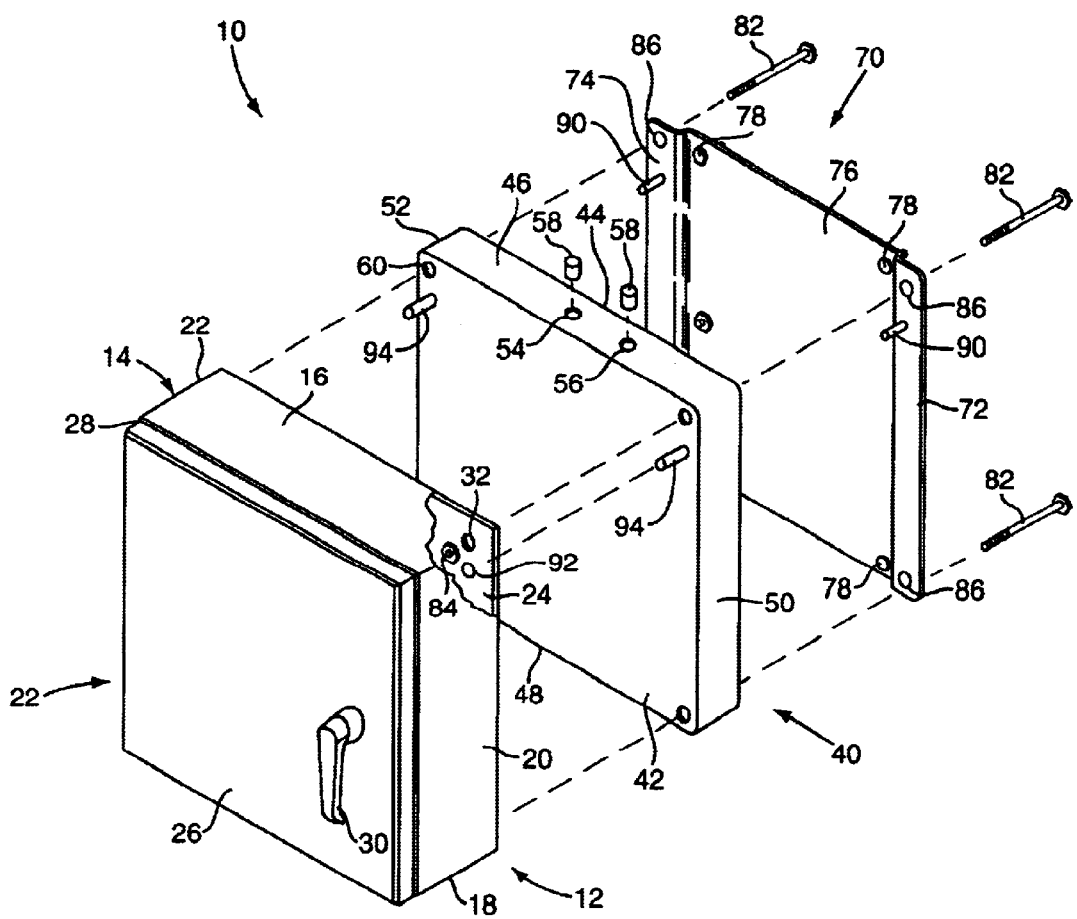
FIG. 4 is an exploded perspective view illustrating a second embodiment of the modular electronics enclosure of the present invention.

FIG. 4 illustrates a second embodiment on the modular electronics enclosure 10 of the present invention. The second embodiment of the electronics enclosure 10 uses many of the same components as the first embodiment. Therefore, the reference numerals used to describe the first embodiment will also be used in the description of the second embodiment to indicate the similar components.

Figure 5:
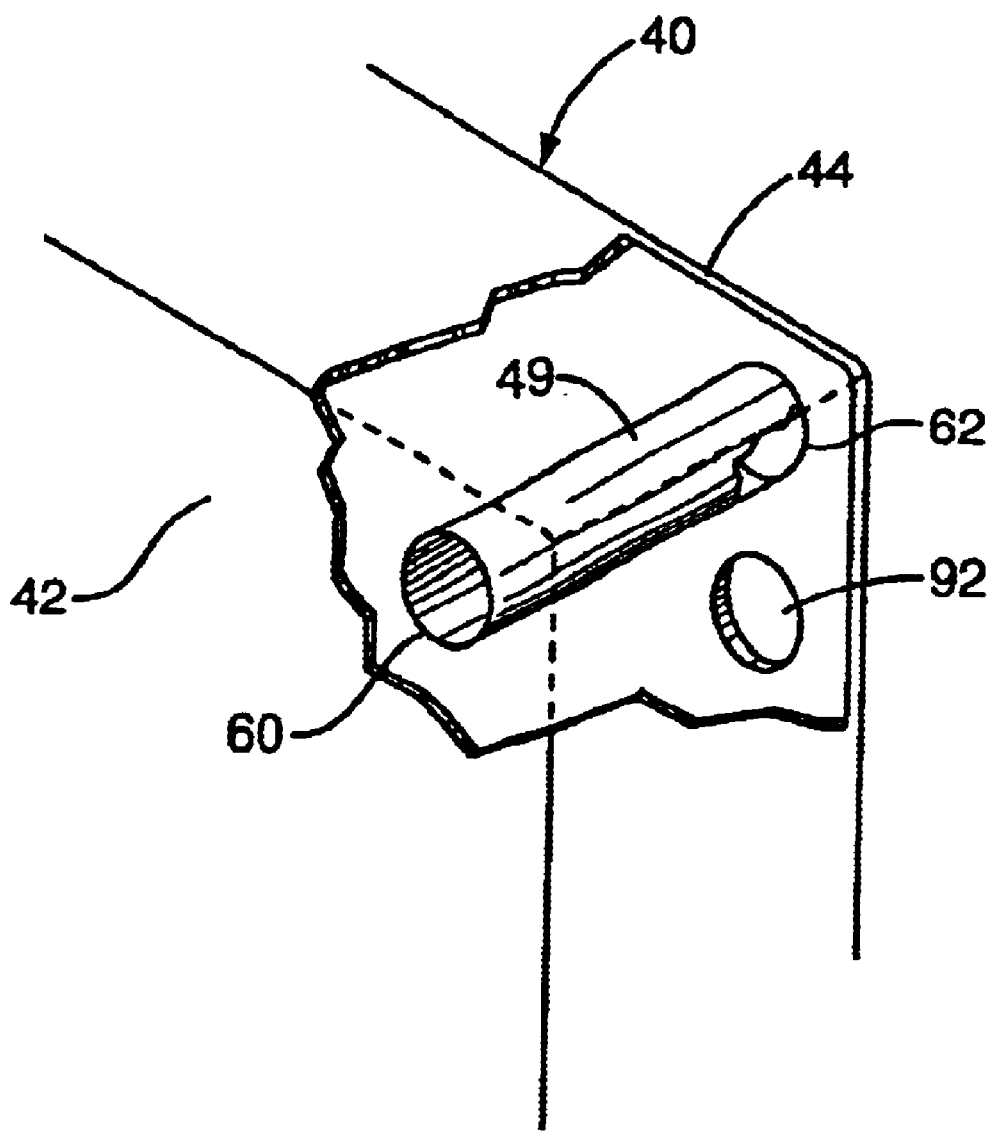
FIG. 5 is a partial perspective view of the heat absorption module with a portion cutaway to illustrate the construction of the heat absorption module.

The second embodiment includes a housing 12, a heat absorption module 40, and a mounting bracket 70. The housing 12 is essentially the same as the first embodiment; whereas the heat absorption module 40 and mounting bracket 70 are slightly modified. In the second embodiment, the sides 50, 52 of the heat absorption module 40 are flush with the lateral edges of the front wall 42 and back wall 44. The opening 60 in the front wall 42 are connected to the openings 62 in the back wall 44 by sleeves 49 (FIG. 5). The sleeves 49 define a sealed passage through the interior of the heat absorption module 40 for the mounting hardware (e.g., carriage bolt 82) to pass through the heat absorption module 40. The mounting bracket 70 has openings 86 in place of the mounting studs 80 of the first embodiment. The openings 86 in the mounting bracket 70 align with the openings 60, 62 in the heat absorption module 40 and the openings 32 in the housing 12. A single carriage bolt 82 and nut 84 can therefore be used at each corner of the enclosure to secure the entire assembly together. The carriage bolt 82 is inserted from the rear of the mounting bracket 70 as shown in FIG. 4 and passes through the sleeve 49 in the heat absorption module 40. The exposed end of the carriage bolt 82, on which the nut 84 is threaded, is contained inside the housing 12.

The mounting bracket 70 in the second embodiment may include mating elements to align and support the heat absorption module 40 or housing 12. The mating elements may comprise, for example, locating pins 90 on the mounting bracket 70 that insert into locating holes 92 in either the back wall 44 of the heat absorption module 40 or the back wall 24 of the housing 12. The heat absorption module 40 likewise may include locating pins 94 that insert into locating holes 92 in the back wall 24 of the housing 12. The locating pins 90, 94 help support the components before the carriage bolts 82 are inserted. Those skilled in the art will recognize that the locating pins 90, 94 and locating holes 92 could be reversed or that other forms of mating elements that interlock with one another could be used.

When the heat absorption module 40 is used, heat generated by the electronics inside the housing 12 or by the solar load is absorbed by the housing 12 and passed through conduction to the heat absorption module 40. While below its phase change temperature, the PCM will absorb and remove heat from the housing 12 as the temperature inside the housing 12 increases. After reaching the phase change temperature, the PCM will continue absorbing heat from the housing 12, but the temperature of the housing 12 and PCM will remain substantially constant until the PCM changes phase. A PCM can be selected which has a phase change temperature that corresponds to the maximum allowable temperature of the electronics enclosure 10. Therefore, until the PCM completely changes phase, the maximum allowable temperature inside the housing 12 will not be exceeded.

In order not to exceed the maximum allowable temperature inside the housing 12, the heat absorption module 40 must be able to absorb the energy of the solar load on the enclosure 10 without completely changing phase. Therefore, enough PCM must be used to absorb the solar load for as long as it is present. Since the solar load occurs only during the day, the PCM can absorb the energy during the daylight hours and pass the heat back to the housing 12 through conduction to be dissipated at night. Therefore, the amount of PCM used may be computed based on the latent heat of the PCM and the maximum solar load that could be absorbed by the enclosure 10 over one day.

Since the enclosure 10 can dissipate the heat generated by the electronics without the heat absorption module 40, the heat absorption module 40 is not required. The present invention allows the heat absorption module 40 to be deployed when needed and to be omitted when the enclosure 10 is not subjected to solar loading. Using the present invention, the same housing 12 and mounting bracket 70 can be used in applications where solar loading is present, as well as applications when no solar loading is present. Thus, only one housing 12 and one mounting bracket 70 is required. The use of the same parts for both shaded and unshaded applications requires fewer parts to be stocked and simplifies ordering. The additional size, weight, and expense of the heat absorption module 40 is only added when needed. In addition, the present invention allows an enclosure 10 initially deployed without the heat absorption module 40 to be easily upgraded to include a heat absorption module 40 at a later time.

What is claimed is:

1. An electronics enclosure comprising:
   a mounting bracket adapted to mount to a support structure;
   a heat absorption module acting as a heat sink adapted to mount to the mounting bracket; and
   a housing containing electronic circuitry comprising electronic components and adapted to mount alternatively to either the mounting bracket or the heat absorption module.

2. The electronics enclosure of claim 1 wherein the mounting bracket includes one or more mounting studs and wherein the heat absorption module and the housing each include mounting holes to receive the mounting studs on the mounting bracket.

3. The electronics enclosure of claim 2 wherein the mounting studs are externally threaded.

4. The electronics enclosure of claim 3 wherein the heat absorption module is secured to the mounting bracket by a nut threaded onto the mounting stud.

5. The electronics enclosure of claim 4 wherein the housing is secured to the heat absorption module by a threaded fastener.

6. The electronics enclosure of claim 3 wherein the housing is secured to the mounting bracket by a nut threaded onto the mounting stud.

7. The electronics enclosure of claim 1 wherein the mounting bracket and the housing include aligned mounting holes.

8. The electronics enclosure of claim 7 further including a threaded fastener insertable through the aligned mounting holes in the mounting bracket and the housing to secure the housing to the mounting bracket.

9. The electronics enclosure of claim 7 wherein the mounting bracket and the housing include mating elements.

10. The electronics enclosure of claim 9 wherein the mating elements comprises one or more locating pins on one of the mounting bracket and the housing and one or more locating holes on the other of the mounting bracket and the housing to receive corresponding locating pins when the housing is mounted to the mounting bracket.

11. The electronics enclosure of claim 7 wherein the heat absorption module further comprises one or more mounting holes aligned with the mounting holes in the mounting bracket and the housing.

12. The electronics enclosure of claim 11 further including one or more threaded fasteners insertable through the aligned mounting holes in the mounting bracket, the heat absorption module, and the housing to secure the heating module and housing to the mounting bracket.

13. The electronics enclosure of claim 11 wherein the mounting bracket and the heat absorption module include mating elements.

14. The electronics housing of claim 13 wherein the mating elements comprise one or more locating pins on one of the mounting bracket and the heat absorption module and one or more locating holes on the other of the mounting bracket and the heat absorption module to receive corresponding locating pins when the heat absorption module is mounted to the mounting bracket.

15. The electronics enclosure of claim 14 wherein the heat absorption module and housing include mating elements.

16. The electronics housing of claim 15 wherein the mating elements comprise one or more locating pins on one of the heat absorption module and the housing and one or more locating holes on the other of the heat absorption module and the housing to receive corresponding locating pins when the housing is mounted to the heat absorption module.

17. The electronics enclosure of claim 1 wherein the heat absorption module contains a phase change material.

18. The electronics enclosure of claim 1 wherein the electronic circuitry in the housing is telecommunications circuits.

19. A method of installing an electronics enclosure comprising:
   providing a mounting bracket adapted to mount to an electronics housing comprising a plurality of electronic components and a heat absorption module acting as a heat sink;
   when the electronics housing is subject to solar loading, mounting the heat absorption module to the mounting bracket;
   when the electronics housing is subject to solar loading, mounting the electronics housing to the heat absorption module such that the heat absorption module is disposed between the mounting bracket and the electronics housing; and
   when the electronics housing is not subject to solar loading, mounting the electronics housing directly to mounting bracket without the heat absorption module.

20. The method of claim 19 further comprising aligning the heat absorption module with the mounting bracket by inserting a first mating element on the heat absorption module with a second mating element on the mounting bracket.

21. The method of claim 20 further comprising aligning the electronics housing with the heat absorption module by mating a third mating element on the heat absorption module with a fourth mating element on the electronics housing.

22. The method of claim 19 wherein mounting the heat absorption module to the mounting bracket comprises securing the heat absorption module to the mounting bracket using one or more first threaded fasteners.

23. The method of claim 19 wherein mounting the electronics housing to the heat absorption module comprises securing the electronics housing to the heat absorption module using one or more second threaded fasteners.

24. The method of claim 19 wherein mounting the heat absorption module to the mounting bracket comprises inserting a threaded fastener through aligned mounting openings in heat absorption module and the mounting bracket.

25. The method of claim 24 wherein mounting the electronics housing to the heat absorption module comprises inserting a threaded fastener through aligned mounting openings in heat absorption module and the electronics housing.

26. The method of claim 25 wherein the threaded fasteners extend through aligned mounting openings in the mounting bracket, the heat absorption module, and the electronics housing.

* * * * *